United States Patent
Gao et al.

(10) Patent No.: US 11,605,626 B2
(45) Date of Patent: Mar. 14, 2023

(54) ESD CIRCUIT WITH CURRENT LEAKAGE COMPENSATION

(71) Applicant: NXP B.V., Eindhoven (NL)

(72) Inventors: Jian Gao, Nijmegen (NL); Marcin Grad, Bemmel (NL)

(73) Assignee: NXP B.V., Eindhoven (NL)

( * ) Notice: Subject to any disclaimer, the term of this patent is extended or adjusted under 35 U.S.C. 154(b) by 40 days.

(21) Appl. No.: 17/400,160

(22) Filed: Aug. 12, 2021

(65) Prior Publication Data

US 2023/0050770 A1 Feb. 16, 2023

(51) Int. Cl.
 *H01L 27/02* (2006.01)
 *H05K 1/02* (2006.01)
 *H02H 9/04* (2006.01)

(52) U.S. Cl.
 CPC ......... *H01L 27/0266* (2013.01); *H02H 9/046* (2013.01); *H05K 1/0259* (2013.01)

(58) Field of Classification Search
 CPC ... H01L 27/0266; H02H 9/046; H05K 1/0259
 USPC .......................................................... 361/56
 See application file for complete search history.

(56) References Cited

U.S. PATENT DOCUMENTS

| | | | |
|---|---|---|---|
| 6,667,650 B2 | 12/2003 | Gammie et al. | |
| 7,573,748 B2 | 8/2009 | Bedarida et al. | |
| 9,172,243 B2 | 10/2015 | Kunz, Jr. et al. | |
| 9,692,229 B2 | 6/2017 | Kunz, Jr. et al. | |
| 2010/0214706 A1* | 8/2010 | Crespo ................ | H01L 27/0259 361/56 |
| 2013/0077195 A1* | 3/2013 | Stockinger ............ | H02H 9/046 361/56 |
| 2015/0295399 A1* | 10/2015 | Wang .................... | H02H 9/045 361/56 |
| 2015/0318275 A1* | 11/2015 | Chen ................... | H01L 27/0285 361/56 |
| 2016/0149403 A1 | 5/2016 | Ikeda | |
| 2022/0131369 A1* | 4/2022 | Loiseau ............. | H01L 27/0248 |

FOREIGN PATENT DOCUMENTS

DE 102006021847 B4 * 7/2015 ............. H02H 9/041

OTHER PUBLICATIONS

Gerdemann, A., "When Good Trigger Circuits Go Bad: A Case History", EOS/ESD Symposium Proceedings, Sep. 11-16, 2011.
Yen, C., "The Effect of IEC-Like Fast Transients on RC-Triggered ESD Power Clamps", IEEE Transactions on Electron Devices, vol. 56, No. 6, Jun. 2009.

* cited by examiner

Primary Examiner — Dharti H Patel
(74) Attorney, Agent, or Firm — David G. Dolezal

(57) ABSTRACT

An ESD protection circuit includes a trigger transistor that is responsive to a detection signal indicating an ESD event. The trigger transistor pulls the voltage of a hold node towards a voltage of a power supply rail in response to the detection signal indicating an ESD event. The ESD protection circuit includes a replica trigger transistor whose leakage current controls current provided to the hold node after the detection signal no longer indicates an ESD event to compensate for leakage current through the trigger transistor.

20 Claims, 3 Drawing Sheets

ESD CIRCUIT WITH CURRENT LEAKAGE COMPENSATION

BACKGROUND OF THE INVENTION

Field of the Invention

This invention relates to ESD circuit protection with current leakage compensation.

Background

An ESD (Electrostatic discharge) protection circuit is utilized for protecting circuits from ESD events. An ESD event may occur when a charged object (e.g. a human finger) inadvertently contacts a conductive surface of an integrated circuit (e.g. a contact pad) or a conductive surface of an integrated circuit package coupled to the pad where charge at an elevated voltage is applied to the conductive surface due to the contact. Being at an elevated voltage, such charge may cause voltage differentials across the devices of the integrated circuit that may exceed their safe operating areas and damage those devices. An ESD event may also occur when a charged conductive surface of a circuit contacts an external object where charge is transferred between the conductive surface and the external object.

Some ESD protection circuits utilize an ESD detection circuit for providing a detection signal to indicate an ESD event. This detection signal controls a trigger transistor that is used to place a node at a trigger voltage for making conductive a clamp path to discharge current from the ESD event. In some instances, the node is connected to an input of an inverter whose output is connected to a clamp transistor of a clamp path. In some instances, the node may be connected to a capacitor to provide capacitance to the node. In some conditions, leakage current through the trigger transistor after an ESD event may prevent the node from returning to a non trigger voltage, thereby causing circuit latch on.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an ESD protection circuit includes a trigger transistor that is responsive to a detection signal indicating an ESD event. The trigger transistor pulls the voltage of a hold node towards a voltage of a power supply rail in response to the detection signal indicating an ESD event. The ESD protection circuit includes a replica trigger transistor whose leakage current controls current provided to the hold node after the detection signal no longer indicates an ESD event to compensate for leakage current through the trigger transistor. In some embodiments, providing current to the hold node to compensate for leakage current through a trigger transistor may prevent a possible latch on condition after an ESD event has subsided where the voltage of the hold node does not transition back to a non ESD state after the ESD event due to the leakage current through the trigger transistor. Such circuitry may also advantageously prevent latch on in instances where a transient such as power on or spurious noise may erroneously trigger the ESD detection circuit.

Figure 1:
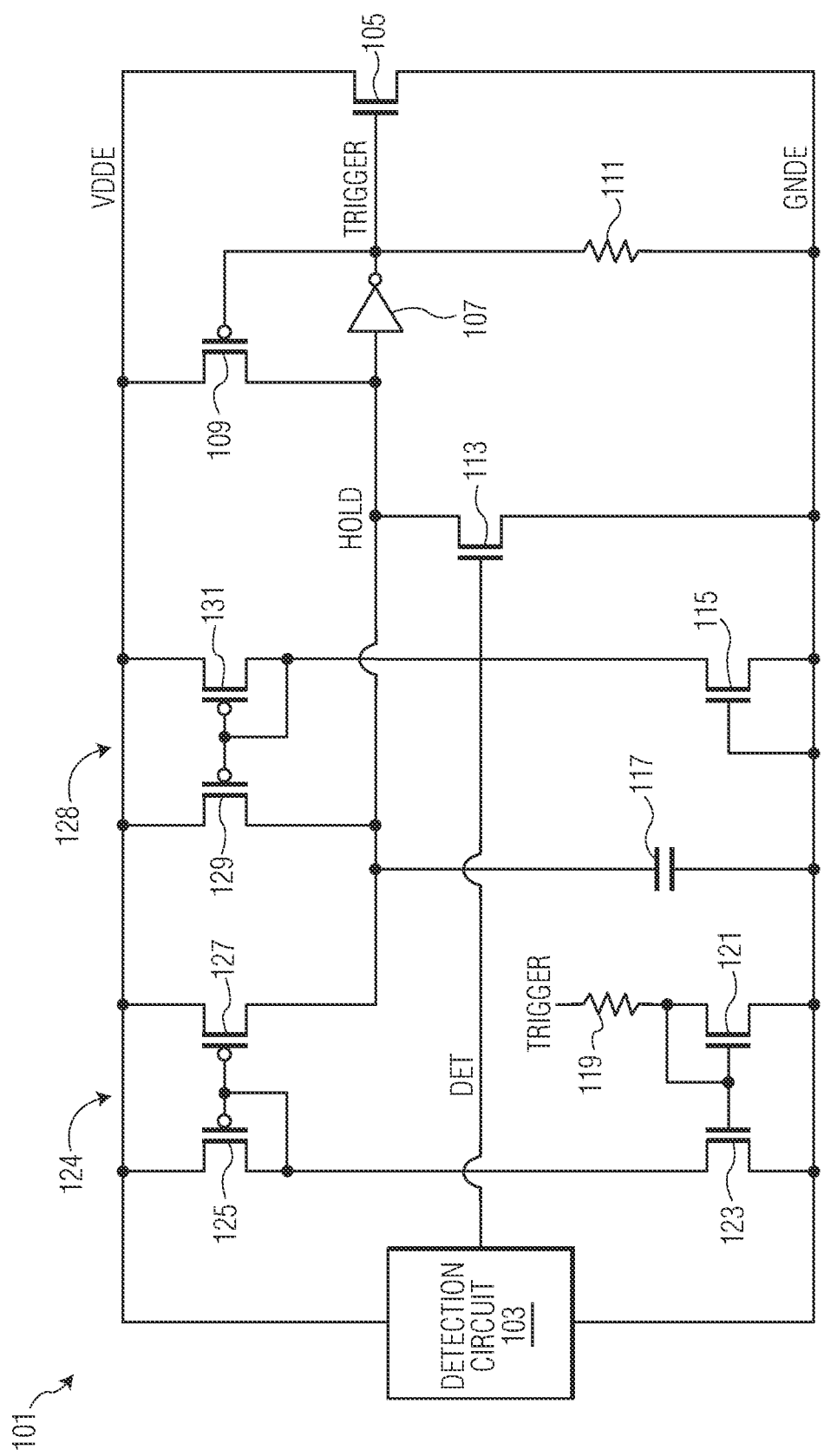
FIG. 1 is a circuit diagram of an ESD protection circuit according to one embodiment of the present invention.

FIG. 1 is a circuit diagram of an ESD protection circuit 101 of an integrated circuit according to one embodiment of the present invention. Circuit 101 includes a detection circuit 103 which is coupled to a power supply rail VDDE to monitor for an ESD event that affects rail VDDE. In one example, an ESD event affecting rail VDDE may occur when a charged object contacting a pad of a packaged IC coupled to rail VDDE transfers a charge through the pad to rail VDDE which creates a voltage differential between rails VDDE and power supply ground rail GNDE that may damage circuitry of the integrated circuit. In response to the detection of an ESD event, circuit 103 asserts a detection signal (DET). In one embodiment, detection circuit 103 is a slew rate detection circuit that determines when an ESD event affects rail VDDE when the rise in the voltage differential between power supply rails VDDE and GNDE exceeds a particular rate (e.g. a rate greater than a normal powering up event). However, other types of detection circuits may be used in other embodiments.

Circuit 101 includes trigger transistor 113 having a gate that is controlled by the detection signal (DET). In response to the assertion of the detection signal, transistor 113 becomes conductive to pull the voltage of HOLD node towards the voltage of power supply rail GNDE. When the voltage of the HOLD node goes below the threshold voltage of inverter 107, the output of inverter 107 (TRIGGER signal) is asserted at a high voltage to make clamp transistor 105 of a clamp path between rails VDDE and GNDE conductive to provide a conductive path to discharge ESD current from power supply rail VDDE to power supply ground rail GNDE. Resistor 111 is located between the output of inverter 107 and power supply ground rail GNDE.

Circuit 101 includes circuitry for generating a charging current to charge capacitor 117 for pulling the voltage of HOLD node back to the voltage of rail VDDE when the detection signal (DET) is no longer asserted to indicate an ESD event. When the TRIGGER signal is asserted during an ESD event, current flows through resistor 119 and through transistor 121 to generate a current through transistor 123 in that NFET transistors 123 and 121 are in a current mirror configuration to implement a current mirror stage 120. Circuit 101 includes a current mirror stage 124 of PFET transistors 125 and 127 where transistor 127 acts as a current source to provide current to the HOLD node when the TRIGGER signal is asserted. When the detection signal DET is de-asserted in response to detection circuit 103 no longer detecting an ESD event, the current from current source 127 charges capacitor 117 to raise the voltage of the HOLD node. When the voltage of the HOLD node crosses the threshold voltage of inverter 107, the TRIGGER signal is de-asserted and clamp transistor 105 is placed in a nonconductive state such that charge no longer flows between the VDDE and GNDE rails. With the TRIGGER signal de-asserted, current source 127 no longer provides current to the HOLD node. Circuit 101 includes a keeper circuit that includes PFET 109 that weakly holds the voltage of the HOLD node at the voltage of rail VDDE when the TRIGGER signal is de-asserted. The capacitance of capacitor 117 provides a delay to the de-assertion of the TRIGGER signal from the de-assertion of the detection signal (DET). Some embodiments do not include capacitor 117. With at least some of these embodiments, the capacitance of the gates of the transistors of inverter 107 is used to provide a time constant to the de-assertion of the TRIGGER signal from the de-assertion of the detection signal (DET).

In some embodiments, it may be possible that during certain conditions when coming out of an ESD event where the DET signal is de-asserted, leakage current through trigger transistor 113 may prevent the HOLD node from charging up to the threshold voltage of inverter 107. In such conditions, the amount of leakage current would be greater than the amount of current provided by transistor 127. As such, the TRIGGER signal does not de-assert in these instances and the circuit latches on. This described latch on issue may occur during high temperatures, where VDDE is at a lower voltage from clamp transistor being conductive such that the current provided by transistor 127 is reduced, at smaller process nodes, and/or where manufacturing process variations may produce NFETs (such as transistor 113) that are susceptible to high leakage current.

In the embodiment shown, circuit 101 includes circuitry to provide current to the HOLD node to compensate for the amount of leakage current through trigger transistor 113. Circuit 101 includes a replica trigger transistor 115 that is of the same type and includes similar properties as transistor 113 such that its leakage current will be proportional to the leakage current through transistor 113 during those conditions when leakage current is problematic. In some embodiments, replica transistor 115 is located in close proximity to transistor 113 on an integrated circuit. In one embodiment, replica transistor 115 is the same size as transistor 113, but in other embodiments it may be a different size (e.g. a scaled replica). In the embodiment shown, the source of replica transistor 115 is connected to the GNDE power rail and is biased at GNDE so as to be in a nonconductive state (similar to transistor 113 when the detection signal DET is de-asserted).

Circuit 101 includes a current mirror stage 128 with PFETs 129 and 131 in a current mirror configuration. The drain of transistor 115 is connected to the drain of PFET 131 such that the leakage current through transistor 115 sets the voltage at the gates of transistors 129 and 131 to control the amount of current provided to the HOLD node where transistor 129 serves as a current source. By using the replica transistor 115 to control the amount of compensation current, the amount of compensation current provided can match (or slightly exceed) the amount of leakage current, where changes in the amount of leakage current can generate corresponding changes in the amount of compensation current. For example, if the amount of leakage current through transistor 113 increases (e.g. due to temperature increase), the amount of leakage current through transistor 115 increases, and the amount of compensation current provided by the current source of transistor 129 increases as well. Correspondingly, if there is lower amount of leakage current through transistor 113, then transistor 129 will provide a correspondingly lower amount of compensation current to the HOLD node. Thus, in situations where there is minimal leakage current, transistor 129 will reduce its compensation current to the HOLD node so as not to cause the HOLD node to rise faster than expected during an ESD event.

In one embodiment, transistor 115 has a smaller width than transistor 113 such that the amount of leakage current through transistor 115 is proportionally smaller than the amount of leakage current through 113. In such an embodiment, the multiplication factor of current mirror 128 is sized so that the amount of compensation current provided by the current source of transistor 129 is equal to or slightly above (e.g. 105% of) the leakage current through transistor 113. For example, if transistor 115 is ⅕ the size of transistor 113, then current mirror 128 would have a multiplication factor of 5.025 to 1 to provide a compensation current that is slightly higher than the leakage current through transistor 113. In other embodiments, the proportionality ratio of the sizes of transistors 113 and 115 may be of other values (e.g. 10 to 1, 2 to 1, or 1 to 1) where the multiplication factor of current mirror 128 would be of other values.

One advantage of using compensation circuitry with a replica transistor for controlling the amount of compensation current to the HOLD node after an ESD event is that the amount of compensation current provided is based on the amount of leakage current through the trigger transistor as indicated by the amount of leakage current through the replica transistor. If the conditions are such that minimal leakage current is flowing through trigger transistor 113, then minimal compensation current would be provided to the HOLD node so as not to affect ESD response times of circuit 101. Accordingly, an ESD protection circuit with such leakage current compensation circuitry may be advantageous over similar prior art ESD protection circuits without the leakage current compensation circuitry.

ESD circuit 101 may be part of a larger ESD protection circuit of an integrated circuit. For example, an integrated circuit may include multiple clamp paths with clamp transistors (similar to clamp transistor 105) located in various parts of the integrated circuit that are coupled between the VDDE power rail and the GNDE power rail. Also, other embodiments may include multiple detection circuits (similar to detection circuit 103) in various locations of an integrated circuit that monitor ESD events that affect the VDDE power supply rail at other locations. In some embodiments, the output of invertor 107 (and the outputs of multiple inverters similar to inverter 107 located around an integrated circuit in some embodiments) would be connected to a TRIGGER bus (not shown) where each clamp transistor (similar to transistor 105) of multiple clamp paths would be connected to the trigger bus to such that the all clamp transistors would be made conductive to dissipate the ESD current of an ESD event.

In one embodiment, circuit 101 is implemented in an integrated circuit where the VDDE and GNDE rails are connected to external terminals (e.g. a VDDE pad and a GNDE pad) of the integrated circuit. The integrated circuit may include other power pads and include signal pads (not shown). The integrated circuit may be packaged in an encapsulant (e.g. molding compound, resin) by itself or with other integrated circuits to form an integrated circuit package that is implemented in electronic systems. In such a package, rails VDDE and GNDE would be electrically coupled to external terminals (e.g. pads, pins, leads, bumps) of the integrated circuit package.

Figure 2:
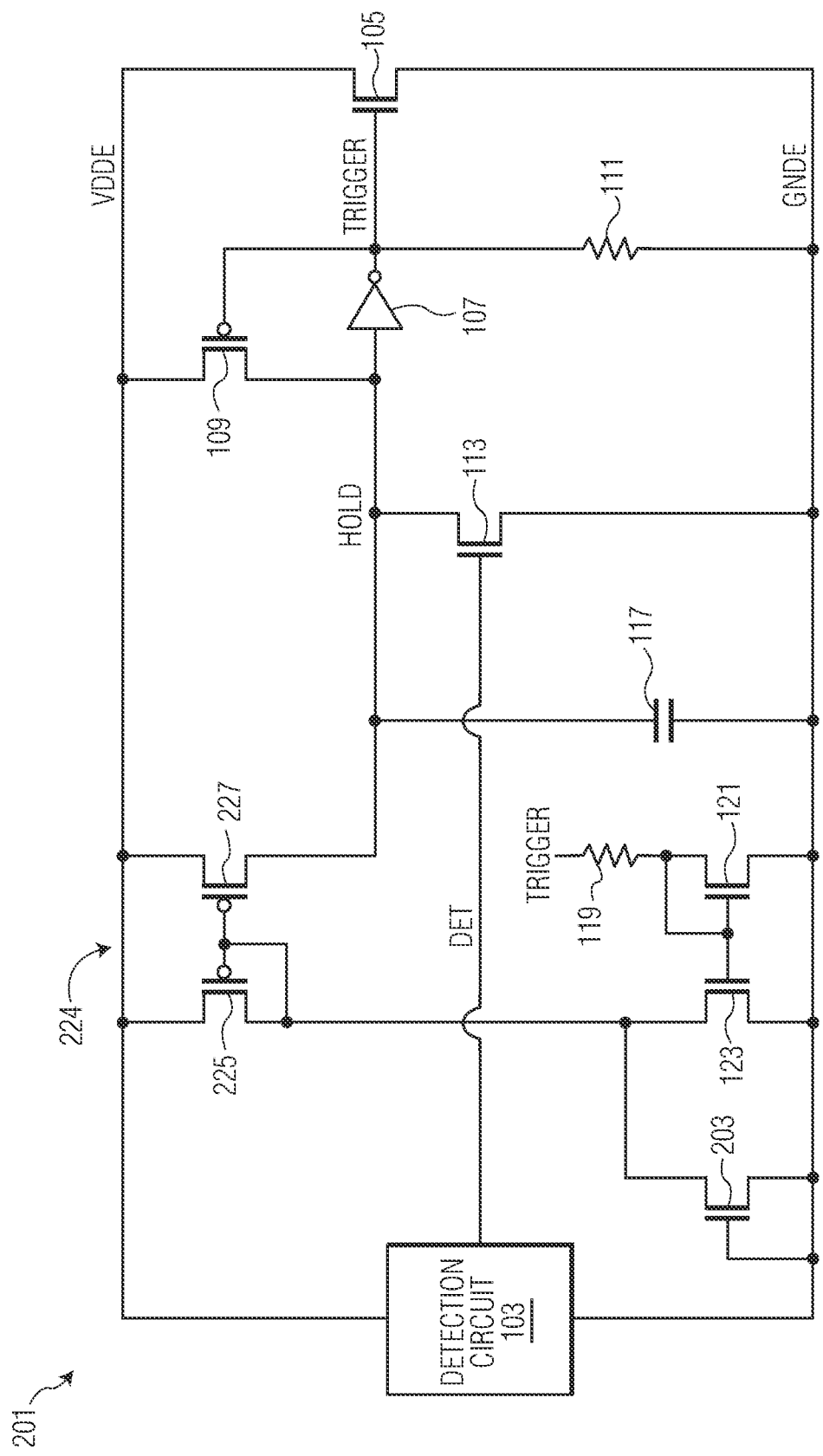
FIG. 2 is a circuit diagram of an ESD protection circuit according to another embodiment of the present invention.

FIG. 2 is a circuit diagram of another embodiment of an ESD protection circuit 201. The items in FIG. 2 with the same numbers as the items in FIG. 1 perform similar functions. Circuit 201 includes a replica trigger transistor 203 which is a replica of trigger transistor 113. Circuit 201 also includes a current mirror stage 224 with PFET transistors 225 and 227 in a current mirror configuration. In the embodiment of FIG. 2, both replica transistor 203 and transistor 123 of current mirror 120 are connected in parallel to the drain of transistor 225. Accordingly, the current source implemented by transistor 227 provides current to the HOLD node either when the TRIGGER signal is asserted as controlled by current mirror 120 or when there is leakage current through transistor 113 as controlled by replica transistor 203. At some point after the DET signal is de-asserted and before the TRIGGER signal is de-asserted, both the TRIGGER signal is asserted and leakage current may be flowing through transistor 113. During such conditions, one component of the current provided by transistor 227 to the HOLD node is caused by the assertion of the TRIGGER signal (as controlled by current mirror 120) to raise the voltage of the HOLD node when the detection signal is de-asserted and a second component of the current is to compensate for leakage current through transistor 113 (as controlled by replica transistor 203).

Circuit 201 of FIG. 2 utilizes less components than circuit 101 of FIG. 1 in that current mirror stage 224 of circuit 201 performs the functions of current mirror stages 124 and 128 of circuit 101. However with circuit 201, resistor 119, current mirror stage 120, and replica transistor 203 have to be configured to utilize the same multiplication factor of current mirror stage 224 for both functions (raise the voltage of the HOLD node from assertion of the TRIGGER signal and to compensate for leakage current of the trigger transistor 113). In some embodiments, it may be advantageous to implement two different current mirror stages (124 and 128 in FIG. 1) so as to utilize a different current mirror multiplication factor for each function.

Figure 3:
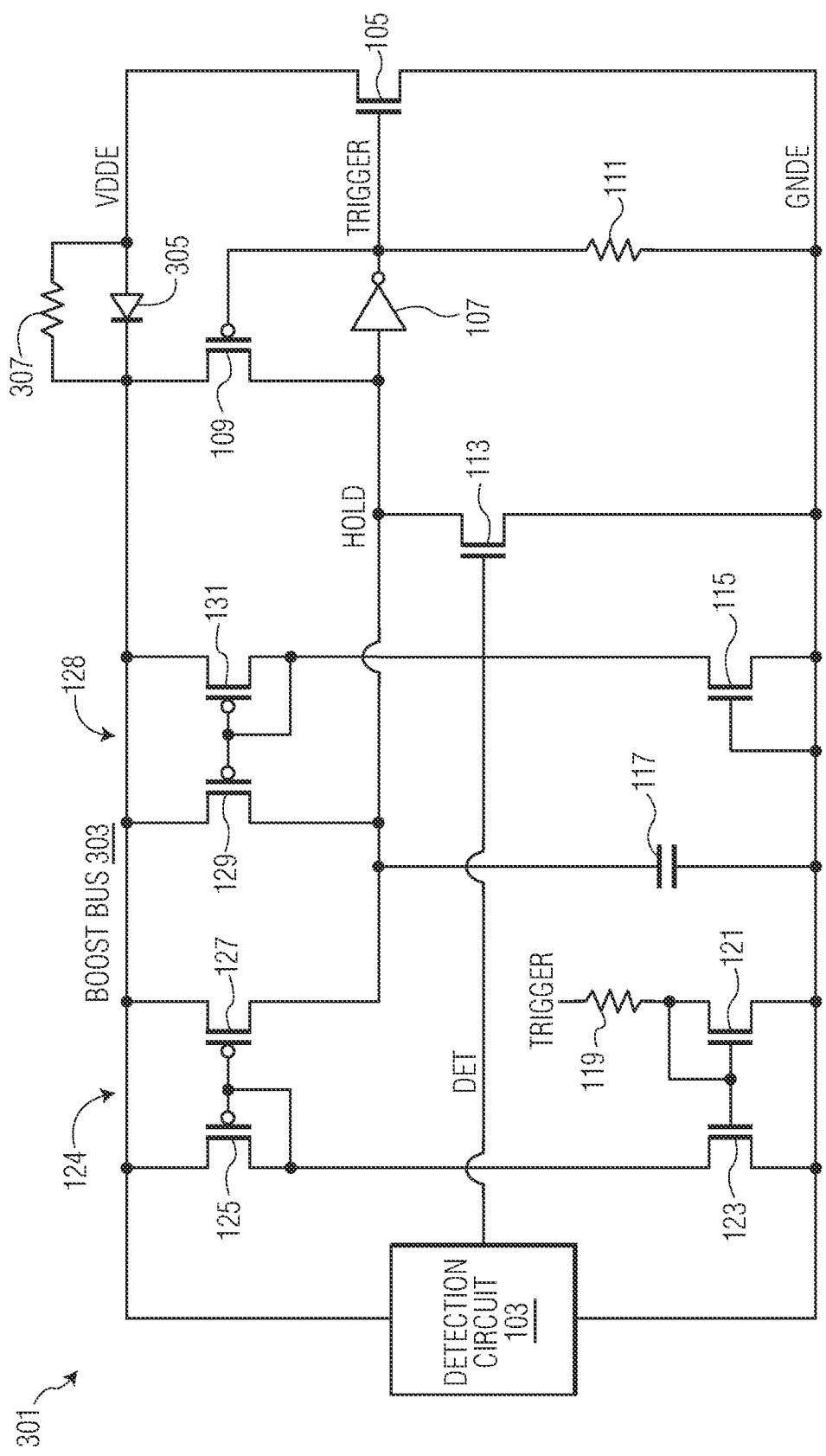
FIG. 3 is a circuit diagram of an ESD protection circuit according to another embodiment of the present invention.

FIG. 3 is a circuit diagram of another embodiment of an ESD protection circuit 301. The items in FIG. 3 having the same numbers as the items in FIG. 1 perform a similar function. In the embodiment of FIG. 3, items of the ESD protection circuitry are coupled to a boost bus 303 instead of power supply rail VDDE. Detection circuit 103 monitors boost bus 303 for ESD events. Also, current mirror stages 124 and 128 and keeper PFET 109 are coupled to boost bus 303. In addition, the high power supply rail of inverter 107 (not shown) is coupled to boost bus 303. Boost bus 303 is coupled to the VDDE rail by a diode 305 and resistor 307 connected in parallel. In other embodiments, boost bus 303 and the VDDE power rail may be coupled by other devices e.g. such as with a switch.

In some embodiments, the boost bus 303 is biased at a slightly higher voltage than VDDE during an ESD event so that the trigger circuitry has a higher drive voltage. During an ESD event that affects the VDDE bus, a higher voltage on the VDDE rail will raise the voltage of boost bus 303 through diode 303. In some embodiments, the implementation of a boost bus in an ESD protection circuit may be especially advantageous if a signal pad is being protected by the ESD protection circuit.

In other embodiments, an ESD protection circuit may be configured differently, have different components, operate in a different manner, and/or protect different parts of an integrated circuit. For example, although FIGS. 1-3 show that the protection circuit protects against ESD events that affect the VDDE power supply rail, an ESD protection circuit of may be used to discharge ESD current form other conductive structures of an integrated circuit such as signal pads. In other embodiments, an ESD protection circuit may include other types of transistors (e.g. bipolar transistors). In some embodiments, the clamp path may include more than one clamp transistor.

The circuitry, devices, configurations, features, and/or methods described herein with respect to one embodiment may be implemented with the circuitry, devices, configurations, features, and/or methods of the other embodiments. A source and a drain are current electrodes of a FET. A gate is a control electrode of a FET.

In one embodiment, a circuit includes an ESD detection circuit including an output to provide a detection signal indicative of an ESD event. The circuit includes a clamp path for providing a current path from a first node to a second node to discharge ESD current from the first node to the second node during an ESD event. The circuit includes a trigger transistor having a control electrode responsive to the detection signal for placing a third node at a trigger voltage during an ESD event. The circuit includes a replica trigger transistor. A leakage current through the replica trigger transistor generates a current to the third node to compensate for a leakage current from the third node through the trigger transistor when the trigger transistor has transitioned to a nonconductive state where an ESD event is no longer indicated by the detection signal from a conductive state where an ESD event was indicated by the detection signal.

In another embodiment, a circuit includes an ESD detection circuit including an output to provide a detection signal indicative of an ESD event. The circuit includes a clamp path for providing a current path from a first node to a second node to discharge ESD current from the first node to the second node during an ESD event. The circuit includes a trigger transistor having a control electrode responsive to the detection signal for placing a third node at a trigger voltage during an ESD event. The circuit includes a replica trigger transistor. A leakage current through the replica trigger transistor generates a current to the third node from a current source to compensate for leakage current through the trigger transistor when the detection signal does not indicate an ESD event.

In another embodiment, a method of operating an ESD protection circuit. The method includes asserting a detection signal indicative of an ESD event and making conductive a trigger transistor in response to the asserted detection signal to pull a voltage of a node towards a first power supply rail to make conductive a clamp path to discharge current from an ESD event to the first power supply rail through the clamp path. The method includes de-asserting the detection signal and after the de-asserting the detection signal, using a leakage current through a replica trigger transistor to control a current to the node to compensate for a leakage current from the node through the trigger transistor.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit, comprising:
    an ESD detection circuit including an output to provide a detection signal indicative of an ESD event;
    a clamp path for providing a current path from a first node to a second node to discharge ESD current from the first node to the second node during an ESD event;

a trigger transistor having a control electrode responsive to the detection signal for placing a third node at a trigger voltage during an ESD event;
a replica trigger transistor, wherein a leakage current through the replica trigger transistor generates a current to the third node to compensate for a leakage current from the third node through the trigger transistor when the trigger transistor has transitioned to a nonconductive state where an ESD event is no longer indicated by the detection signal from a conductive state where an ESD event was indicated by the detection signal.

2. The circuit of claim 1 further comprising:
a current source, including an output to provide current to the third node, wherein the current source is controlled by the replica trigger transistor such that leakage current though the replica trigger transistor generates a current through the output to the third node.

3. The circuit of claim 2 wherein the replica trigger transistor is coupled in series to a first transistor, wherein the current source is implemented with a second transistor in a current mirror configuration with the first transistor, wherein a current electrode of the second transistor is coupled to the third node.

4. The circuit of claim 2 further comprising:
a second current source, wherein when a control signal is asserted to make conductive the clamp path to provide a current path to discharge ESD current from the first node to the second node during an ESD event, the second current source provides current to the third node when the control signal is asserted.

5. The circuit of claim 2 wherein when a control signal is asserted to make conductive the clamp path to provide a current path to discharge ESD current from the first node to the second node during an ESD event, the output of the current source provides current to the third node.

6. The circuit of claim 5 wherein control signal is connected to an input of a current mirror stage, the current mirror stage includes a first transistor coupled in parallel to the replica trigger transistor.

7. The circuit of claim 2 wherein the current source is coupled to a fourth node, a diode is located in a path between the first node and the fourth node.

8. The circuit of claim 1 further comprising:
an inverter including an input connected to the third node and an output providing a control signal to a control electrode of the clamp path, wherein the control signal is asserted to make conductive the clamp path to provide a current path to discharge ESD current from the first node to the second node during an ESD event.

9. A circuit, comprising:
an ESD detection circuit including an output to provide a detection signal indicative of an ESD event;
a clamp path for providing a current path from a first node to a second node to discharge ESD current from the first node to the second node during an ESD event;
a trigger transistor having a control electrode responsive to the detection signal for placing a third node at a trigger voltage during an ESD event;
a replica trigger transistor, wherein a leakage current through the replica trigger transistor generates a current to the third node from a current source to compensate for leakage current through the trigger transistor when the detection signal does not indicate an ESD event.

10. The circuit of claim 9 wherein the trigger transistor includes a first current electrode coupled to the third node and a second current electrode coupled to the second node, and the replica trigger transistor includes a first current electrode coupled to the second node and a control electrode coupled to the second node.

11. The circuit of claim 9 further comprising:
wherein the replica trigger transistor is coupled in series to a first transistor of a current mirror, the current mirror includes a second transistor in current mirror configuration with the first transistor, wherein a current electrode of the second transistor is coupled to the third node, wherein the current source is implemented with the second transistor.

12. The circuit of claim 11 wherein the replica trigger transistor and current mirror are sized to compensate for a leakage current from the third node through the trigger transistor when the trigger transistor has transitioned to a nonconductive state where an ESD event is no longer indicated from a conductive state where an ESD event was indicated.

13. The circuit of claim 9 further comprising:
a second current source, wherein when a control signal is asserted to make conductive the clamp path to provide a current path to discharge ESD current from the first node to the second node during an ESD event, the second current source provides current to the third node when the control signal is asserted.

14. The circuit of claim 9 wherein when a control signal is asserted to make conductive the clamp path to provide a current path to discharge ESD current from the first node to the second node during an ESD event, the current source provides current to the third node.

15. The circuit of claim 9 wherein control signal is connected to an input of a current mirror stage, the current mirror stage includes a first transistor coupled in parallel to the replica trigger transistor.

16. The circuit of claim 9 wherein the current source is coupled to a fourth node, a diode is located in a path between the first node and the fourth node.

17. The circuit of claim 9 further comprising:
a capacitor including a first electrode connected to the third node, wherein the capacitor is coupled in parallel to the trigger transistor.

18. A method of operating an ESD protection circuit comprising:
asserting a detection signal indicative of an ESD event;
making conductive a trigger transistor in response to the asserted detection signal to pull a voltage of a node towards a first power supply rail to make conductive a clamp path to discharge current from an ESD event to the first power supply rail through the clamp path;
de-asserting the detection signal;
after the de-asserting the detection signal, using a leakage current through a replica trigger transistor to control a current to the node to compensate for a leakage current from the node through the trigger transistor.

19. The method of claim 18 wherein the using the leakage current through the replica trigger transistor to control the current to the node includes generating the current to the node from a current mirror wherein the current mirror is coupled to the replica trigger transistor such that leakage current though the replica trigger transistor generates a proportional current to the node.

20. The method of claim 19 wherein the replica trigger transistor is coupled in series to a first transistor of the current mirror, the current mirror includes a second transistor in current mirror configuration with the first transistor, wherein a current electrode of the second transistor is coupled to the node.

\* \* \* \* \*